(12) United States Patent
Park et al.

(10) Patent No.: US 12,028,594 B2
(45) Date of Patent: Jul. 2, 2024

(54) CAMERA MODULE AND OPTICAL DEVICE INCLUDING SAME

(71) Applicant: LG INNOTEK CO., LTD., Seoul (KR)

(72) Inventors: Jong Ha Park, Seoul (KR); Won Seob Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/302,417

(22) Filed: Apr. 18, 2023

(65) Prior Publication Data

US 2023/0254557 A1 Aug. 10, 2023

Related U.S. Application Data

(63) Continuation of application No. 17/449,887, filed on Oct. 4, 2021, now Pat. No. 11,665,414, which is a (Continued)

(30) Foreign Application Priority Data

Jun. 26, 2018 (KR) ........................ 10-2018-0073241

(51) Int. Cl.
*H04N 23/52* (2023.01)
*H04N 23/54* (2023.01)
(Continued)

(52) U.S. Cl.
CPC ............. *H04N 23/52* (2023.01); *H04N 23/57* (2023.01); *H05K 1/0278* (2013.01); *H04N 23/54* (2023.01)

(58) Field of Classification Search
None
See application file for complete search history.

(56) References Cited

U.S. PATENT DOCUMENTS

| 11,165,936 B2 | 11/2021 | Park et al. |
| 2009/0122177 A1 | 5/2009 | Murakami |

(Continued)

FOREIGN PATENT DOCUMENTS

| CN | 101872747 A | 10/2010 |
| CN | 103460688 A | 12/2013 |

(Continued)

OTHER PUBLICATIONS

Office Action dated May 24, 2023 in Chinese Application No. 202211089015.0.

(Continued)

*Primary Examiner* — Paul M Berardesca
(74) *Attorney, Agent, or Firm* — Saliwanchik, Lloyd & Eisenschenk

(57) ABSTRACT

An embodiment comprises a lens driving part including a lens, a connection substrate connected to the lens driving part, and a connector part connected to the connection substrate. The connector part comprises a substrate including, on the upper surface thereof, a cavity and a ground layer, a noise shield part located within the cavity of the substrate and contacting the ground layer, and a reinforcement member located on the noise shield part. The reinforcement member is located in the cavity of the substrate and on the upper surface of the substrate. In a top view, the length of one side of the noise shield part is less than the length of one side of the cavity of the substrate.

20 Claims, 11 Drawing Sheets

Related U.S. Application Data continuation of application No. 17/255,816, filed as application No. PCT/KR2019/007728 on Jun. 26, 2019, now Pat. No. 11,165,936.

(51) Int. Cl.
  *H04N 23/57* (2023.01)
  *H05K 1/02* (2006.01)

(56) References Cited

U.S. PATENT DOCUMENTS

| | | |
|---|---|---|
| 2010/0265663 A1 | 10/2010 | Yamashita et al. |
| 2010/0273539 A1 | 10/2010 | Lee et al. |
| 2014/0313403 A1 | 10/2014 | Chen |
| 2015/0373238 A1 | 12/2015 | Tago et al. |
| 2017/0200529 A1 | 7/2017 | Neumann et al. |
| 2019/0104237 A1 | 4/2019 | Sugiyama et al. |
| 2019/0141224 A1 | 5/2019 | Park |
| 2019/0387623 A1 | 12/2019 | Itotani et al. |
| 2020/0244856 A1 | 7/2020 | Kim et al. |

FOREIGN PATENT DOCUMENTS

| | | |
|---|---|---|
| CN | 103929578 A | 7/2014 |
| CN | 105259633 A | 1/2016 |
| CN | 105807537 A | 7/2016 |
| CN | 106161903 A | 11/2016 |
| CN | 106291861 A | 1/2017 |
| CN | 107910340 A | 4/2018 |
| EP | 0 734 318 B1 | 8/2000 |
| JP | 2014-191283 A | 10/2014 |
| KR | 10-2005-0064549 A | 6/2005 |
| KR | 10-2005-0064550 A | 6/2005 |
| KR | 10-2008-0011754 A | 2/2008 |
| KR | 10-2010-0001809 A | 1/2010 |
| KR | 10-2012-0039300 A | 4/2012 |
| KR | 10-1228731 B1 | 2/2013 |

OTHER PUBLICATIONS

Qiang, L. et al., "ON Semiconductor Enhanced (CCD) image sensor performance", pp. 1-3, China Academic Journal Electronic Publishing House, China.

International Search Report in International Application No. PCT/KR2019/007728, filed Jun. 26, 2019.

Supplementary European Search Report dated Jun. 25, 2021 in European Application No. 19824809.8.

Anonymous1, "Conductive/Shielding Adhesive Tapes," Mar. 19, 2014, pp. 1-4, Teraoka.

Notice of Allowance dated Jul. 2, 2021 in U.S. Appl. No. 17/255,816.

Office Action dated Nov. 23, 2021 in Chinese Application No. 201980055093.9.

Office Action dated Jul. 20, 2022 in Korean Application No. 10-2018-0073241.

Office Action dated Sep. 14, 2022 in U.S. Appl. No. 17/449,887.

Notice of Allowance dated Jan. 18, 2023 in U.S. Appl. No. 17/449,887.

CAMERA MODULE AND OPTICAL DEVICE INCLUDING SAME

CROSS-REFERENCE TO RELATED APPLICATIONS

This application is a continuation of U.S. application Ser. No. 17/449,887, filed Oct. 4, 2021; which is a continuation of U.S. application Ser. No. 17/255,816, filed Dec. 23, 2020, now U.S. Pat. No. 11,165,936, issued Nov. 2, 2021; which is the U.S. national stage application of International Patent Application No. PCT/KR2019/007728, filed Jun. 26, 2019, which claims the benefit under 35 U.S.C. § 119 of Korean Application No. 10-2018-0073241, filed Jun. 26, 2018, the disclosures of each of which are incorporated herein by reference in their entirety.

TECHNICAL FIELD

Embodiments relate to a camera module and an optical device including the same.

BACKGROUND ART

It is difficult to apply technology of a voice coil motor (VCM) used in existing general camera modules to a subminiature, low-power camera module, and therefore research related thereto has been actively conducted.

Demand for and production of electronic products, such as smartphones and mobile phones equipped with cameras, have increased. Cameras for mobile phones are trending toward increased resolution and miniaturization. As a result, an actuator has also been miniaturized, increased in diameter, and been made multifunctional. In order to realize a high-resolution camera for mobile phones, improvement in the performance of the camera for mobile phones and additional functions thereof, such as autofocusing, handshake correction, and zooming, are required.

DISCLOSURE

Technical Problem

Embodiments provide a camera module and an optical device including the same, which are capable of improving performance of blocking EMI noise and of reducing the electrical resistance between the reinforcing member and the ground of the board.

Technical Solution

A camera module according to an embodiment includes a lens moving unit including a lens, a connecting board connected to the lens moving unit, and a connector unit connected to the connecting board, wherein the connector unit includes a board including a cavity and a ground layer formed in an upper surface thereof, a noise-blocking unit disposed in the cavity in the board so as to be in contact with the ground layer, and a reinforcing member, which is disposed on the noise-blocking unit and is disposed over the cavity in the board and on an upper surface of the board, and wherein a length of one side of the noise-blocking unit is less than a length of one side of the cavity in the board when viewed in a plan view.

The noise-blocking unit includes a first portion disposed in the cavity in the board and a second portion disposed on the connecting board, an end of the first portion being disposed in the cavity in the board.

A length of a short side of the noise-blocking unit may be less than a length of a long side of the cavity in the board.

A region of the ground layer may define a bottom surface of the cavity in the board.

A length of one long side of the cavity in the board may be greater than a length of another long side of the cavity in the board.

The camera module may further include an adhesive disposed between the reinforcing member and the noise-blocking unit.

The cavity in the board may include a first inner surface, and the noise-blocking unit may include a first surface that faces the first inner surface of the cavity in the board, the first surface of the noise-blocking unit being spaced apart from the first inner surface of the cavity in the board.

The cavity in the board may include a second inner surface that faces the first inner surface and a third inner surface connecting the first inner surface to the second inner surface, and the noise-blocking unit may include a second surface that faces the second inner surface of the cavity in the board and a third surface that faces the third inner surface of the cavity in the board, the second surface of the noise-blocking unit being spaced apart from the second inner surface of the cavity in the board, and the third surface of the noise-blocking unit being spaced apart from the third inner surface of the cavity in the board.

A portion of the adhesive may be disposed in the cavity in the board.

A vertical length of the noise-blocking unit and a vertical length of the adhesive may be less than a vertical length of the cavity, the vertical direction being a direction that is perpendicular to an optical axis of the lens moving unit and extends from a first outer surface to a second outer surface of a second region of the board, and the first and second outer surfaces of the second region facing each other.

The adhesive may include a conductive particle, which is in contact with the ground layer through the noise-blocking unit.

A resistance value between the reinforcing member and the ground layer may be lower than 1 ohm.

A camera module according to another embodiment includes a lens moving unit including a lens, a connecting board connected to the lens moving unit, and a connector unit connected to the connecting board, wherein the connector unit includes a board including a cavity and a ground layer formed in an upper surface thereof, a noise-blocking unit disposed in the cavity in the board so as to be in contact with the ground layer, and a reinforcing member, which is disposed on the noise-blocking unit and is disposed over the cavity in the board and on an upper surface of the board, wherein the noise-blocking unit includes a first portion disposed in the cavity in the board and a second portion disposed on the connecting board, and the end of the first portion is disposed in the cavity in the board.

Advantageous Effects

Embodiments are able to improve the performance of blocking EMI noise and to reduce the electrical resistance between the reinforcing member and the ground of the board.

BEST MODE

Figure 1:
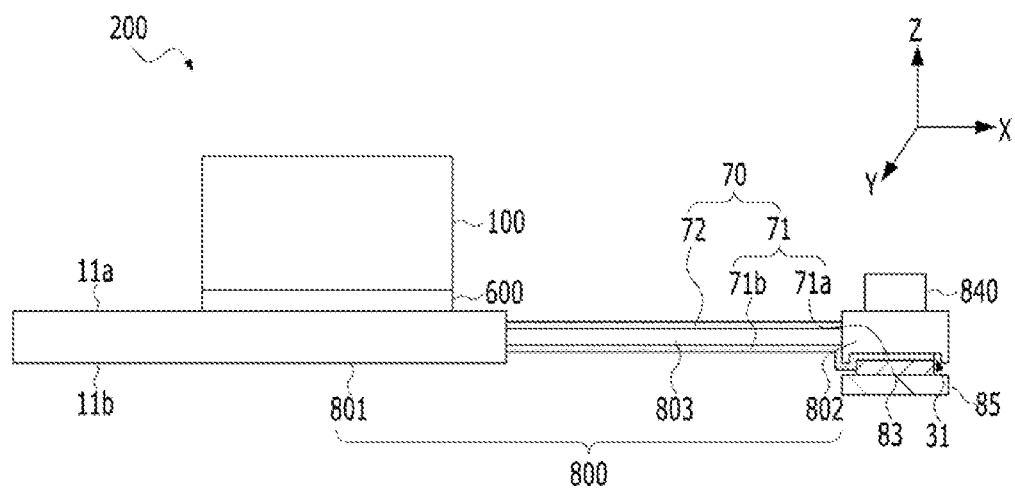
FIG. 1 is a cross-sectional view of the camera module according to an embodiment.

Hereinafter, embodiments will be clearly elucidated via description thereof with reference to the accompanying drawings. In the following description of the embodiments, it will be understood that, when an element such as a layer (film), region, pattern, or structure is referred to as being "on" or "under" another element, it can be "directly" on or under the other element, or can be "indirectly" disposed such that an intervening element may also be present. In addition, it will also be understood that the criteria for "on" or "under" are determined on the basis of the drawings.

In the drawings, the dimensions of layers may be exaggerated, omitted or illustrated schematically for clarity and convenience of description. In addition, the dimensions of constituent elements may not accurately reflect the actual dimensions thereof. Wherever possible, the same reference numbers will be used throughout the drawings to refer to the same or like parts.

Hereinafter, a camera module according to an embodiment will be described with reference to the accompanying drawings. For the convenience of description, although the camera module according to the embodiment is described using a rectangular coordinate system (x, y, z), the lens moving unit may be described using some other coordinate systems, and the embodiments are not limited with regard thereto. In the respective drawings, the X-axis direction and the Y-axis direction mean directions perpendicular to an optical axis, i.e. the Z axis. The Z-axis direction, which is the optical-axis direction, may be referred to as a "first direction", the X-axis direction may be referred to as a "second direction", and the Y-axis direction may be referred to as a "third direction".

The camera module according to the embodiment of the present invention is capable of performing an "auto-focusing function". Here, the "auto-focusing function" serves to automatically focus an image of a subject on an image sensor surface.

In addition, the camera module according to the embodiment may perform a function of "handshake correction". Here, the function of "handshake correction" may serve to inhibit the contour line of a captured image from being indistinctly formed due to vibration caused by shaking of the user's hand when capturing a still image.

FIG. 1 is a cross-sectional view of the camera module 200 according to the embodiment.

Referring to FIG. 1, the camera module 200 may include a board 800, a holder 600 disposed on the board 800, a lens moving unit 100 mounted on the holder 600, a connector 840 disposed on the board 800, a noise-blocking unit 70, a reinforcing member 85 disposed on the board 800, and an adhesive 83 interposed between the reinforcing member 85 and the board 800.

The board 800 may include a plurality of pattern layers, an insulation layer interposed between the plurality of pattern layers, cover layers disposed on the outermost pattern layers, among the plurality of pattern layers, so as to protect the pattern layers, and a contact (or a via) adapted to conductively connect the pattern layers to each other.

The board 800 may include a first region 801 in which the lens moving unit 100 is disposed, a second region 802 in which the connector 840 is disposed, and a third region 803 connecting the first region 801 to the second region 802.

The first region 801 of the board 800 may alternatively be referred to as a "first board", the second region 802 of the board may alternatively be referred to as a "second board", and the third region 803 of the board 800 may alternatively be referred to as a "connecting board".

In another embodiment, the first region 801 or the first board of the board 800 may be included in the lens moving unit 100.

Each of the first region 801 and the second region 802 of the board 800 may include a flexible substrate 800-1 and rigid substrates 800-2 and 800-3. The reason for this is because each of the first region 801 and the second region 802 requires a predetermined strength in order to be capable of supporting the lens moving unit 100 and the connector 840.

For example, each of the first region 801 and the second region 802 of the board 800 may include a first rigid substrate 800-2, disposed on the flexible substrate 800-1, and a second rigid substrate 800-3, disposed beneath the flexible substrate 800-1.

The third region 802 of the board 800 may include the flexible substrate 800-1. The flexible substrate 800-1 included in the first to third regions 801 to 803 of the board 800 may be integrally formed.

Although each of the first region 801 and the second region 802 may be a rigid substrate and the third region may be a flexible substrate, as described above, the disclosure is not limited thereto. In another embodiment, at least one of the first to third regions 801 to 803 of the board 800 may include a rigid substrate, and the remaining ones of the first to third regions 801 to 803 may include a flexible substrate.

Figure 5:
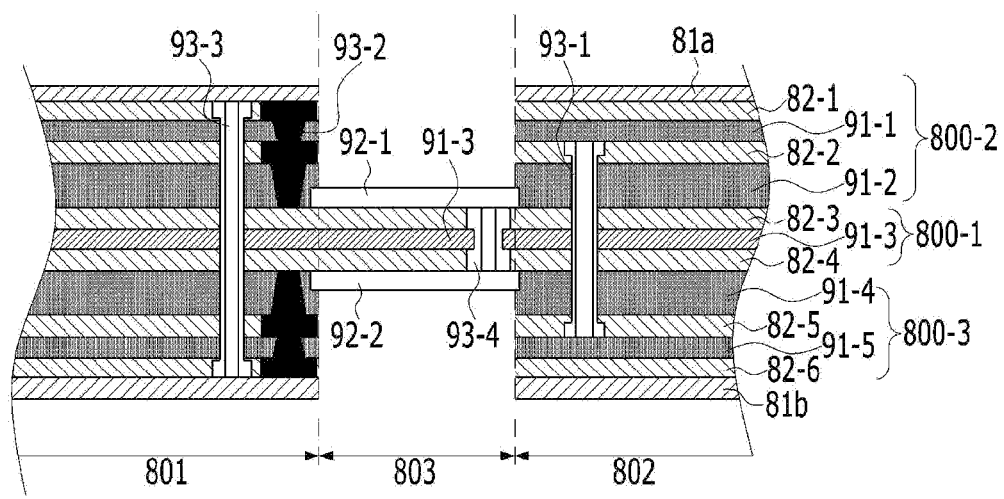
FIG. 5 is a cross-sectional view of an embodiment of the board shown in FIG. 1.

FIG. 5 is a cross-sectional view of an embodiment of the board 800 shown in FIG. 1.

Referring to FIG. 5, the board 800 may include a plurality of pattern layers 82-1 to 82-6, which are disposed so as to be spaced apart from each other in the optical-axis direction or in the vertical direction, insulation layers (or insulation barriers or insulation films) 91-1 to 91-5 interposed between the plurality of pattern layers 82-1 to 82-6 so as to insulate the pattern layers from each other, and cover layers 81a, 81b, 92-1 and 92-2 for protecting the plurality of pattern layers 82-1 to 82-6 from external impact or the like.

Referring to FIG. 5, the flexible substrate 800-1 may include an insulation layer 91-3, a pattern layer 82-3 disposed on the insulation layer 91-3, and a pattern layer 82-4 disposed beneath the insulation layer 91-3.

The first rigid substrate 800-2 may include pattern layers 82-1 and 82-2 disposed on the flexible substrate 800-1 (for example, the pattern layer 82-3), an insulation layer 91-1 interposed between the pattern layers 82-1 and 82-2, and an insulation layer 91-2 interposed between the flexible substrate 800-1 (for example, the pattern layer 82-3) and the first rigid substrate 800-2 (for example, the pattern layer 82-2).

The second rigid substrate 800-3 may include pattern layers 82-5 and 82-6 disposed beneath the flexible substrate 800-1 (for example, the pattern layer 82-4), an insulation layer 91-4 interposed between the flexible substrate 800-1 (for example, the pattern layer 82-4), and an insulation layer 91-5 interposed between the pattern layers 82-5 and 82-6.

The insulation layer 91-3 of the board 800 may be a flexible insulation layer, for example, a polyimide layer capable of being flexibly bent.

Each of the insulation layers 91-1, 91-2, 91-4 and 91-5 of the board 800 may be a rigid insulation or a prepreg layer, which has a greater strength or hardness than the flexible insulation layer.

For example, each of the pattern layers 82-1 to 82-6 may alternatively be referred to as a copper foil, a conductive layer or a conductive pattern, and each of the insulation layers 91-1 to 91-5 may alternatively be referred to as an insulation barrier or an insulation film.

Referring to FIG. 5, although the number of pattern layers of the flexible substrate 800-1 is two and the number of pattern layers of each of the first and second rigid substrates 800-2 and 800-3 is two, the disclosure is not limited thereto. In another embodiment, the number of pattern layers of the flexible substrate 800-1 and the number of pattern layers of each of the first and second rigid substrates 800-2 and 800-3 may be one or more.

The cover layers of the board 800 may include a cover layer 81a disposed on the pattern layer 82-1 of the first rigid substrate 800-2, a cover layer 81b disposed on the pattern layer 82-6 of the second rigid substrate 800-3, a cover layer 92-1 disposed on the pattern layer 82-3 of the flexible substrate 800-1 of the third region 803, and a cover layer 92-2 disposed beneath the pattern layer 82-4 of the flexible substrate 800-1 of the third region 803. Each of the cover layers of the board 800 may be made of an insulation material, for example, a solder resist material.

Furthermore, the board 800 may include a via adapted to conductively connect two pattern layers to each other, among the pattern layers 82-1 to 82-6 of the flexible substrate 800-1 and the first and second rigid substrates 800-2 and 800-3. Here, the via may alternatively be referred to as a contact or a contact via.

For example, the board 800 may include at least one via 93-4, adapted to conductively connect the pattern layers 82-1 to 82-6 of the flexible substrate 800-1 to each other, and at least one via 93-1 to 93-4, adapted to conductively connect two of the pattern layers 82-1 to 82-6 of the first and second rigid substrates 800-2 and 800-3 to each other.

A cavity 31 in the board 800 may expose the pattern layer 82-6 of the board 800 from a second surface 11b of the second region 802 of the board 800. Here, the cavity 31 may alternatively be referred to as a recess.

The pattern layer 82-6 may include a "ground layer", or may alternatively be referred to as a "ground layer" or an "earth layer".

The portion of the ground layer 82-6 that is exposed through the cavity 31 may form the bottom surface of the cavity 31 in the second board 802.

The holder 600 may be disposed on the first region 801, and the lens moving unit 100 may be disposed or mounted on the holder 600 disposed on the board 800.

The connector 840 may be disposed on the second region (or the "second board") 802 of the board 800. For example, the connector 840 may be disposed on one surface of the second region 802 of the board 800. The cavity 31 may be formed in the outer surface of the second region 802 of the board 800, and may expose the ground layer from the other surface of the second region 802.

The connector 840, the second region (or the second board) 802 of the board 800, at least a portion of the noise-blocking unit 70 and the reinforcing member 85 may together constitute a "connector" unit.

For example, the holder 600 and the lens moving unit 100 may be disposed on the first surface 11a of the first region 801 of the board 800, and the connector 840 may be disposed on the first surface 11a of the second region 802 thereof.

The terminals of the lens moving unit 100 may be conductively connected to at least one of the pattern layers (for example, 82-1 to 82-6) of the first region 801 of the board 800, and the terminals of the connector 840 may be conductively connected to at least one of the pattern layers 82-1 to 82-6 of the second region 802 of the board 800.

For example, the terminals of the lens moving unit 100 may be conductively connected to the pattern layers 82-3 and 82-4 of the flexible substrate 800-1 of the first region 801, and the terminals of the connector 840 may be conductively connected to the pattern layers 82-3 and 82-4 of the flexible substrate 800-1 of the second region 802 of the board 800. The terminals of the lens moving unit 100 may be conductively connected to the terminals of the connector 840 via the flexible substrate 800-1.

The noise-blocking unit 70 may be disposed beneath the second region 802 of the board 800.

Furthermore, the noise-blocking unit 70 may be disposed at both upper and lower portions of the flexible substrate 800-1 of the third region 803 of the board 800. The noise-blocking unit 70 may alternatively be referred to as a noise-blocking layer, an "EMI (Electro Magnetic Interference)-blocking unit", an EMI-shielding unit, an EMI film or an EMI tape.

The noise-blocking unit 70 may include a first noise-blocking portion 71 and a second noise-blocking portion 72.

The first noise-blocking portion 71 may be disposed beneath the second region 802 and the third region 803 of the board 800. For example, the first noise-blocking portion may include a first portion (or a first region) 71a, which is disposed in the cavity 31 in the second region 802 of the board 800, and a second portion (or a second region) 71b, which is disposed beneath the flexible substrate 800-1 of the third region 803 of the board 800.

The second noise-blocking portion 72 may be disposed on the third region 803 of the board 800.

The noise-blocking unit 70 may further include a portion that is disposed on the upper surface and/or the lower surface of the first region 803 of the board 800.

The second portion 71b of the first noise-blocking portion 71 may be disposed or formed only on a portion of the third region (or the connecting board) 803.

The first noise-blocking portion 71 may further include a third portion 71c, which is disposed between the first portion 71a and the second portion 71b so as to connect the first portion 71a to the second portion 71b.

For example, the third portion 71c may be disposed on the lower surface (or the cover layer 81b) of the second region 802 of the board 800, which connects a fourth inner surface 31d of the cavity 31 to a fourth outer surface 5d of the second region 802 of the board 800.

The reinforcing member 85 may be disposed beneath the second region (or the "second board") 802 of the board 800.

For example, the reinforcing member 85 may be disposed beneath the first portion 71*a* of the first noise-blocking portion 71, which is disposed beneath the second region 802 of the board 800.

For example, the reinforcing member 85 may be disposed above the cavity 31 in the second board 802 and on the upper surface of the second board 802.

The reinforcing member 85 may be made of conductive material having high thermal conductivity, for example, metal. Although the reinforcing member 85 may be made of, for example, stainless steel, aluminum or the like, the disclosure is not limited thereto.

The reinforcing member 85 may be conductively connected to the ground terminal of the board 300 so as to serve as a ground for protecting the camera module from electrostatic discharge (ESD).

The adhesive 83 may be disposed between the reinforcing member 85 and the first noise-blocking portion 71.

For example, the adhesive 83 may be disposed between the first portion 71*a* of the first noise-blocking portion 71 and the reinforcing member 85 so as to fix or attach the reinforcing member 85 to the second region 802 of the board 800.

Figure 3:
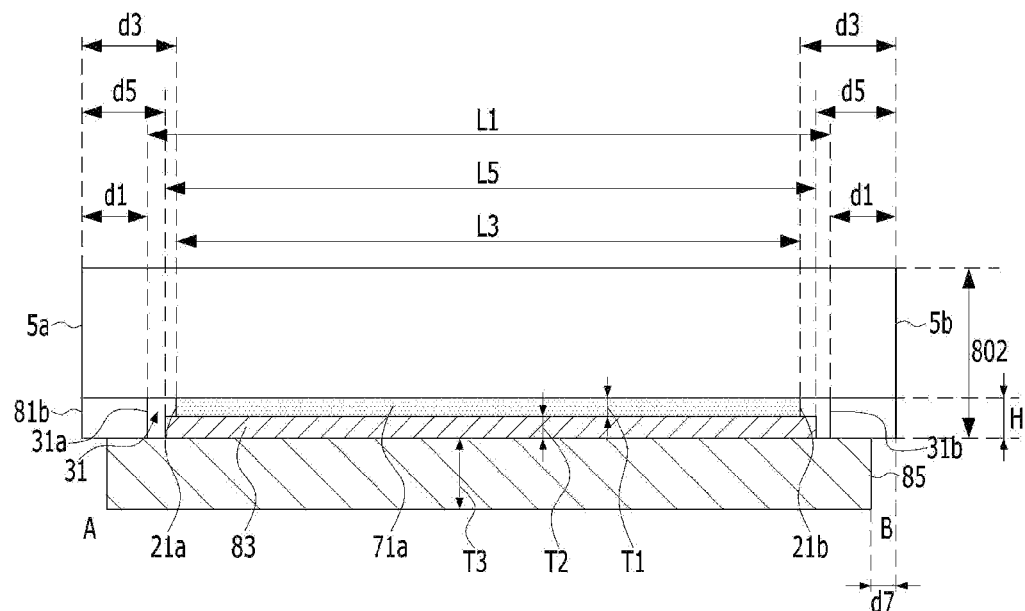
FIG. 3 is a cross-sectional view taken along line A-B in FIG. 2D.

Referring to FIG. 3, although the upper surface of the reinforcing member 85 may be spaced apart from the lower surface of the second board 802 (for example, the lower surface of the cover layer 81*b*), the disclosure is not limited thereto. In another embodiment, the upper surface of the reinforcing member 85 may be in contact with the lower surface of the second board 802 (for example, the lower surface of the cover layer 81*b*).

A portion of the adhesive 83 may be disposed in the cavity 31 in the second board.

The second region (or the second board) 802 of the board 800 according to the embodiment may have therein the cavity 31 having an inlet through which a portion of the pattern layer (for example, 82-6, see FIG. 5) is exposed.

Here, the region of the pattern layer 82-6 that is exposed through the cavity 31 may serve as a ground layer for grounding the board 800, or may be conductively connected to the ground of the board 800.

The region of the pattern layer 82-6 that is exposed through the cavity 31 may be conductively connected to the ground pin or the terminal of the connector 840.

For example, the cavity 31 may be formed by cutting away a portion of the cover layer 81*b* of the second region 802 of the board 800, and the lower surface of a portion of the pattern layer (for example, 82-6, see FIG. 5) of the second region 802 may be exposed through the cavity 31.

The first noise-blocking portion 71 may be disposed in the cavity 31 in the second region 802 of the board 800. At least a portion of the periphery of the first noise-blocking portion 71 may be disposed in the cavity 31.

For example, the first portion 71*a* of the first noise-blocking portion 71 may be disposed in the cavity 31 in the second region 802 of the board 800.

The adhesive 83 may be disposed on the first noise-blocking portion 71 disposed in the cavity 31, and the reinforcing member 85 may be disposed on the adhesive 83.

By disposing the first portion 71*a* of the first noise-blocking portion 71 in the cavity 31 in the second region 802 of the board 800 and then disposing the adhesive 83 on the first portion 71*a* of the first noise-blocking portion 71 disposed in the cavity 31, the embodiment is able to block or reduce the noise generated by the camera module and to reduce the resistance between the reinforcing member 85 and the board 800 (for example, the ground (GND)).

Figure 4:
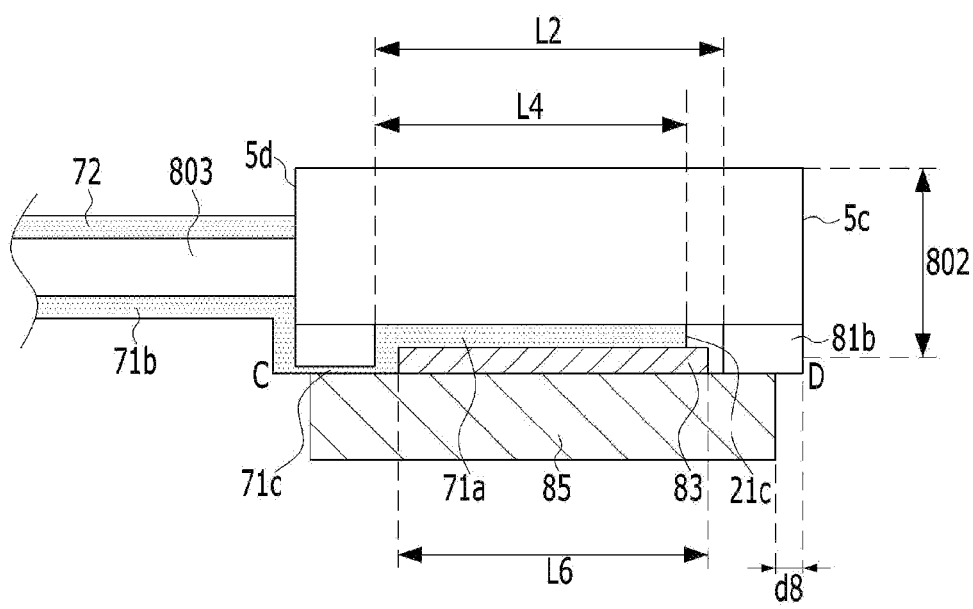
FIG. 4 is a cross-sectional view taken along line C-D in FIG. 2D.

FIGS. 2A to 2D illustrate a procedure of coupling the noise-blocking unit 71, the adhesive 83 and the reinforcing member 85 to the board 800. FIG. 3 is a cross-sectional view taken along line A-B in FIG. 2D. FIG. 4 is a cross-sectional view taken along line C-D in FIG. 2D.

Figure 2A:
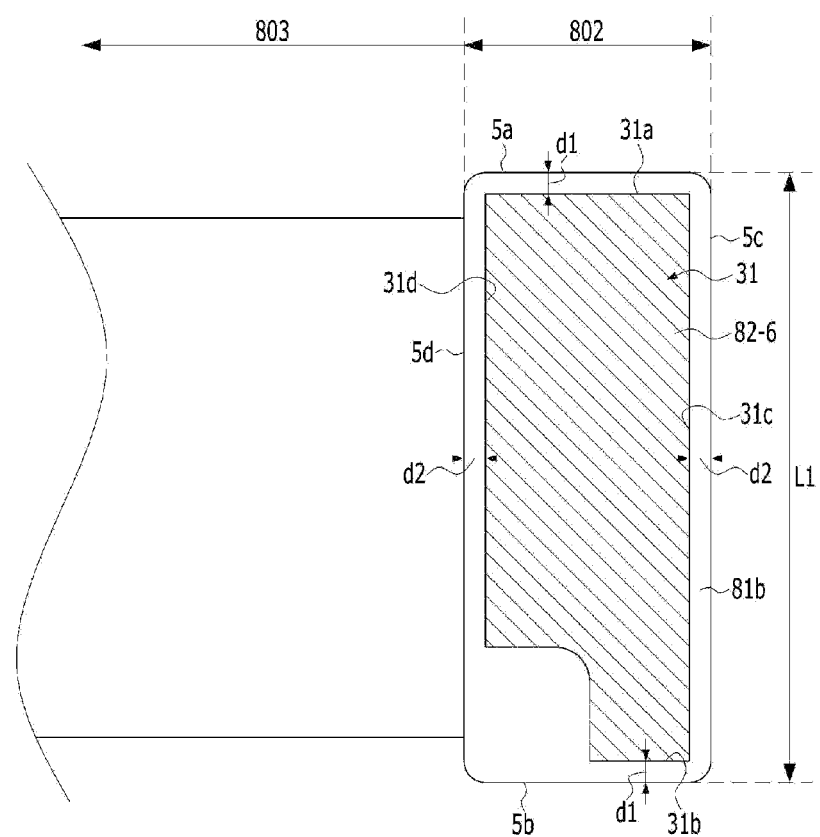
FIGS. 2A to 2D are views illustrating a procedure of coupling a noise-blocking unit, an adhesive and a reinforcing member to a board.
Figure 2B:
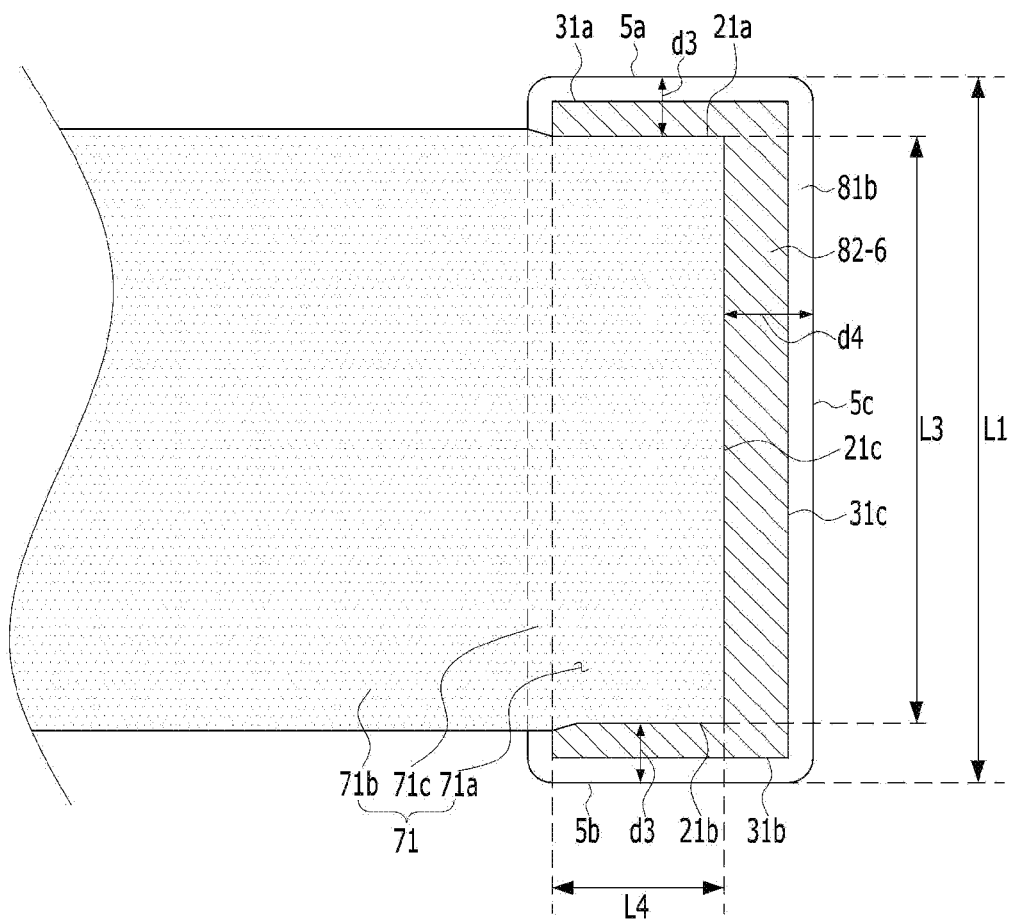
Figure 2C:
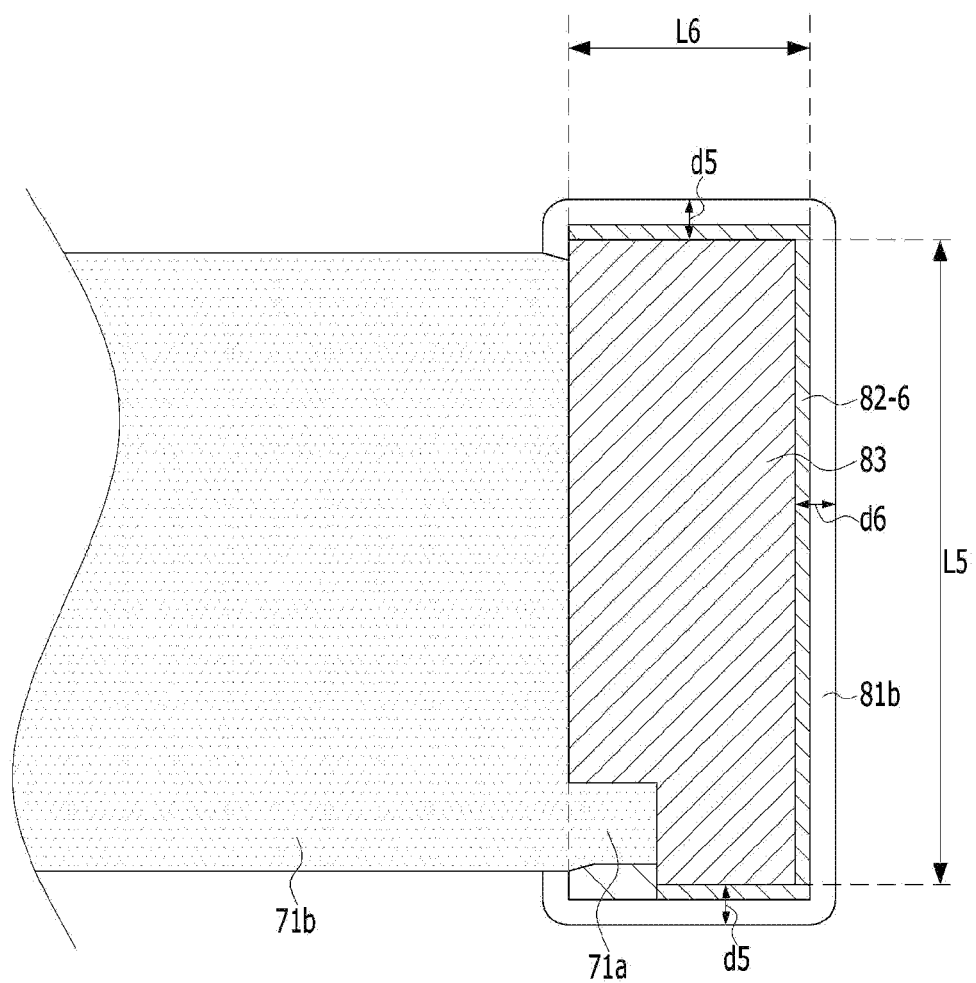
Figure 2D:
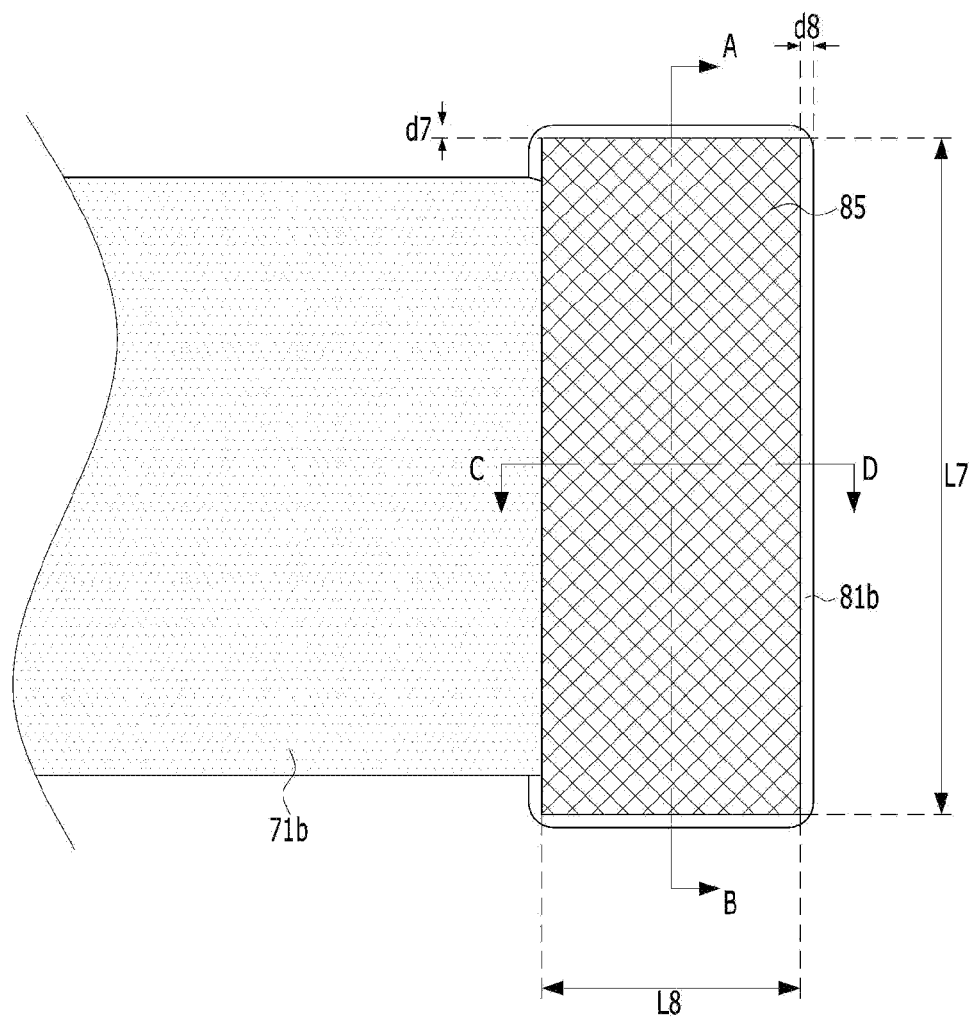

FIGS. 2A to 2D are bottom views illustrating the second region 802 and the third region 803 of the board 800. FIGS. 3 and 4 are cross-sectional views illustrating states in which FIG. 2D is rotated to 180 degrees.

Referring to FIG. 2A, the cavity 31 is formed in the second surface of the second region 802 of the board 800 so as to expose the pattern layer (or the ground layer) 82-6 from the second surface. The exposed ground layer is not limited to the shape shown in FIG. 2A (for example, an 1' shape), and may have any of various polygonal shapes (for example, a rectangular shape, a triangular shape or the like) or a circular shape.

Referring to FIG. 2A, the left and lower end of the pattern layer 82-6 may not be exposed through the cavity 31. The left and lower end of the pattern layer 82-6 may be provided with a ground layer (for example, a "first ground layer" or a "digital ground layer"), which is exposed through the cavity 31, and another ground layer (for example, a "second ground layer" or an "analog ground layer"), which is separated or spaced apart from the first ground layer.

In another embodiment, the second ground layer may also be exposed through the cavity 31, and the first noise-blocking portion 71 and the adhesive 83 may be disposed between the exposed ground layer and the reinforcing member 85.

For example, the cavity 31 may be formed so as to expose the lower surface of the pattern layer 82-6 by removing a portion of the cover layer 81*b* of the second region 802 of the board 800.

The second region 802 of the board 800 may have four outer surfaces 5*a* to 5*d*.

For example, the plan view of the second region 802 of the board 800 may have a rectangular shape having four sides 5*a* to 5*d*.

Each of the distances d1 and d2 between the outer surfaces (or sides) 5*a* to 5*d* of the second region 802 and the cavity 31 may range from 0.3 mm to 0.5 mm.

The depth H of the cavity 31 may be equal to the thickness of the cover layer 81*b* of the board 800. For example, the depth H of the cavity 31 may be the length of the lens or the lens barrel 400 of the lens moving unit 100. For example, the depth H may range from 21 μm to 24 μm. For example, the depth H may be 23 μm.

Referring to FIG. 2B, the portion 71*a* of the first noise-blocking portion 71 is disposed in the cavity 31 in the second region 802 of the board 800.

The first noise-blocking portion 71 may include the first portion 71*a* disposed in the cavity 31 in the second region 802 of the board 800 and the second portion 71*b* disposed beneath the third region 803 of the board 800. Furthermore, the first noise-blocking portion 71 may include the third portion connecting the first portion to the second portion.

For example, the second portion 71*b* of the first noise-blocking portion 71 may be disposed on the connecting board 803, and the end of the first portion 71*a* may be disposed in the cavity 31 in the second board 802. For example, a portion of the end of the first portion 71*a* may be disposed in the cavity 31.

The first portion 71*a* of the first noise-blocking portion 71 may be disposed beneath the pattern layer 82-6 of the second region 802 of the board 800 that is exposed through the cavity 31.

The cavity 31 in the board 800 may include the inner surfaces 31a to 31d and the bottom surface. Here, the inner surface of the cavity 31 may alternatively be referred to as a "side wall", a "side surface" or an "inner wall".

For example, the first inner surface 31a and the second inner surface 31b may face each other, and the third inner surface 31c and the fourth side surface 31d may face each other. The third inner surface 31c may connect one end of the first inner surface 31a to one end of the second inner surface 31b, and the fourth inner surface 31d may connect the other end of the first inner surface 31a to the other end of the second inner surface 31b.

The bottom surface of the cavity 31 may be one surface (for example, the lower surface) of the pattern layer 82-6 of the second region 802 of the board 800 that is exposed. The lower surface of the first portion 71a of the first noise-blocking portion 71 may be in contact with the bottom surface of the cavity 31.

For example, the first portion 71a of the first noise-blocking portion 71 may include a first surface 21a (or a "first side surface") that faces the first inner surface 31a of the cavity 31, a second surface 21b (or a "second side surface") that faces the second inner surface 31b of the cavity 31, and a third surface 21c (or a "third side surface") that faces the third inner side surface 31c of the cavity 31.

The side surface of the first portion 71a of the first noise-blocking portion 71 may be positioned in the cavity 31 in the second region 802 of the board 800, and may be spaced apart from the second surface 11b of the second region 802 of the board 800.

For example, the first surface 21a, the second surface 21b and the third surface 21c of the first portion 71a of the first noise-blocking portion 71 may be positioned in the cavity 31 in the second region 802, and may be spaced apart from the second surface 11b of the second region 802 of the board 800.

The vertical length of the second portion 71b of the first noise-blocking portion 71 may be greater than the vertical length L3 of the first portion 71a. The reason for this is to improve the effect of blocking EMI in the third region 803 of the board 800.

The length (or width) L3 of one side of the first noise-blocking portion 71 may be less than the length (or width) L1 of one side of the cavity 31 in the second board 802.

For example, the length of a first long side that is positioned at one side of the cavity 31 of the second board 802 may be greater than the length of a second long side that is positioned at the other side of the cavity 31. For example, the first long side and the second long side may face each other.

For example, the length of a first short side that is positioned at one side of the cavity 31 in the second board 802 may be greater than the length of a second short side that is positioned at the other side of the cavity 31. For example, the first short side and the second short side may face each other.

For example, the length L3 of a short side of the first noise-blocking portion 71 may be less than the length L1 of a long side of the cavity 31 in the second board 802.

The vertical length L3 of the first portion 71a of the first noise-blocking portion 71 may be less than the vertical length L1 of the cavity 31 in the board 800 (L3<L1).

The horizontal length L4 of the first portion 71a of the first noise-blocking portion 71 may be less than the horizontal length L2 of the cavity 31 in the board 800 (L4<L2).

For example, the vertical direction may be the direction of Line A-B in FIG. 2D or the y-axis direction in FIG. 1, which is perpendicular to the optical-axis direction of the lens moving unit 100.

Alternatively, the vertical direction may be a direction that is perpendicular to the optical-axis direction of the lens moving unit 100 (or the axis of the image sensor 8100) and extends from the first outer surface 5a to the second outer surface 5b of the second region 802 of the board 800.

Alternatively, the vertical direction may be a direction perpendicular to a direction that extends from the image sensor 810 to the connector 840.

For example, the horizontal direction may be the direction of line C-D in FIG. 2D or the x-axis direction in FIG. 1, which is perpendicular to the optical-axis direction of the lens moving unit 100.

For example, the vertical direction may be a direction that extends from the first inner surface 31a to the second inner surface 31b of the cavity 31 in the board 800, and the horizontal direction may be a direction that extends from the third inner surface 31c to the fourth inner surface 31d of the cavity 31 of the board 800.

For example, the area of the lower surface (or the upper surface) of the first portion 71a of the first noise-blocking portion 71 disposed in the cavity 31 in the board 800 may be smaller the area of the bottom surface of the cavity 31 in the board 800 (or the area of the exposed lower surface of the pattern layer 82-6).

The distance d3 between the first surface 21a of the first portion 71a of the first noise-blocking portion 71 and the first outer surface 5a of the second region 802 of the board 800 or the distance d3 between the second surface 21b of the first portion 71a of the first noise-blocking portion 71 and the second outer surface 5b of the second region 802 of the board 800 may be greater than the distance d1 (d3>d1).

The distance d4 between the third surface 21c of the first portion 71a of the first noise-blocking portion 71 and the third outer surface 5c of the second region 802 of the board 800 may be greater than the distance d2 (d4>d2).

Because the distance d3 is greater than the distance d1 (d3>d1) and the distance d4 is greater than the distance d2 (d4>d2), the first portion 71a of the first noise-blocking portion 71 may be disposed in the cavity 31.

In FIG. 2B, the distance d4 may be greater than the distance d3 (d4>d3). For example, the distance d3 may range from 0.6 mm to 0.8 mm, and the distance d4 may range from 0.9 mm to 1.1 mm. In another embodiment, the distance d4 may be equal to the distance d3 (d4=d3) or may be less than the distance d3 (d4<d3).

Referring to FIG. 3, the first to third surfaces 21a to 21c of the first portion 71a of the first noise-blocking portion 71 may be spaced apart from the first to third inner surfaces 31a to 31c of the cavity 31 in the board 800.

For example, the first surface 21a may be spaced apart from the first inner surface 31a of the cavity 31, the second surface 21b may be spaced apart from the second inner surface 31b of the cavity 31, and the third surface 21c may be spaced apart from the third inner surface 31c of the cavity 31.

The distance between the third surface 21c of the first noise-blocking portion 71 and the third surface 31c of the cavity 31 may be different from the distance between the first surface 21a of the first noise-blocking portion 71 and the first inner surface 31a of the cavity 31 and/or the distance between the second surface 21b of the first noise-blocking portion 71 and the second inner surface 31b of the cavity 31.

For example, the distance between the third surface 21c of the first noise-blocking portion 71 and the third surface 31c of the cavity 31 may be greater than the distance between the first surface 21a and the first inner surface 31a of the cavity 31 and/or the distance between the second surface 21b and the second inner surface 31b of the cavity 31.

For example, the distance between the inner surfaces 31a to 31d of the cavity 31 and the end surfaces (for example, 21a to 21c) of the first noise-blocking portion 71 may be greater than the distance between the inner surfaces 31a to 31d of the cavity 31 and the end surfaces of the adhesive 83. The reason for this is to increase the surface area of the adhesive 83 and thus to increase the adhesive force between the reinforcing member 85 and the second board 802.

For example, although the horizontal (or vertical) distance between the inner surfaces 31a to 31d of the cavity 31 and the end surfaces of the reinforcing member 85 may be greater than the horizontal (or vertical) distance between the inner surfaces 31a to 31d of the cavity 31 and the end surfaces (for example, 21a to 21c) of the first noise-blocking portion 71, the disclosure is not limited thereto. In another embodiment, the former may be equal to or less than the latter.

For example, although the horizontal (or vertical) distance between the inner surfaces 31a to 31d of the cavity 31 and the end surfaces of the reinforcing member 85 may be greater than the horizontal (or vertical) distance between the inner surfaces 31a to 31d of the cavity 31 and the end surfaces of the adhesive 83, the disclosure is not limited thereto. In another embodiment, the former may be equal to or less than the latter.

Referring to FIGS. 2C and 2D, the reinforcing member 85 is attached to the first portion 71a of the first noise-blocking portion 71 disposed in the cavity 31 via the adhesive 83.

For example, the reinforcing member 65 may be fixed or attached to the first portion 71a of the first noise-blocking portion 71 in such a way as to apply or form the adhesive 83 to one surface (for example, the upper surface) of the reinforcing member 85 and then to press the reinforcing member 85 having thereon the adhesive 83 to the first portion 71a of the first noise-blocking portion 71 using a hot press. By virtue of the pressing operation, the upper surface of the reinforcing member 85 may come into contact with the second surface (or the lower surface) 11b of the second region 802 of the board 800.

The adhesive 83 may be conductive adhesive, or may include conductive adhesive (for example, conductive particles). For example, the adhesive 83 may be FGBF-700.

The side surface of the adhesive 83 may be spaced apart from the second surface 11b of the second region 802 of the board 800.

The vertical length L5 of the adhesive 83 may be less than the vertical length L1 of the cavity 31 in the board 800 (L5<L1). The horizontal length L6 of the adhesive 83 may be less than the horizontal length L2 of the cavity 31 in the board 800 (L6<L2).

The vertical length L5 of the adhesive 83 may be greater than or equal to the vertical length L3 of the first portion 71a of the first noise-blocking portion 71.

The horizontal length L6 of the adhesive 83 may greater than or equal to the horizontal length L4 of the first portion 71a of the first noise-blocking portion 71.

The distance d5 between the first side surface of the adhesive 83 and the first outer surface 5a of the second region 802 of the board 800 or the distance d5 between the second side surface of the adhesive 83 and the second outer surface 5b of the second region 802 of the board 800 may be greater than the distance d1 (d5>d1). In another embodiment, the distance d5 may be equal to the distance d1 (d5=d1).

The distance d6 between the third side surface of the adhesive 83 and the third outer surface 5c of the second region 802 of the board 800 may be greater than the distance d2 (d6>d2). In another embodiment, the distance d6 may be equal to the distance d2 (d6=d2).

For example, each of the distance d5 and the distance d6 may range from 0.5 mm to 0.6 mm.

d1:d3 may range from 1:1.2 to 1:2.65, and d2:d4 may range from 1:1.8 to 1:3.65.

d1:d5 may range from 1:1 to 1:2, and d2:d6 may range from 1:1 to 1:2.

If d3/d1 is less than 1.2, because the difference between the horizontal length of the first portion 71a of the first noise-blocking portion 71 and the horizontal length of the cavity 31 is very small, a process margin required to dispose the first portion 71a of the first noise-blocking portion 71 is insufficient, and the first noise-blocking portion 71 may escape outwards from the cavity 31, with the result that the resistance value between the reinforcing member 85 and the ground of the board 800 may increase to 1 ohm or higher.

If d3/d1 is greater than 2.65, the surface area of the first portion 71a of the first noise-blocking portion 71 may decrease, and thus the ability to block noise generated by the camera module may be deteriorated, thereby deteriorating the RF sensitivity of the optical device on which the camera module is mounted.

If d5/d1 and/or d6/d2 is less than 1, the horizontal length of the adhesive 83 may become greater than the horizontal length of the cavity 31, and the adhesive 83 may thus be disposed on the lower surface of the second region 802 outside the cavity 31, with the result that the resistance value between the reinforcing member 85 and the ground of the board 800 may increase to 1 ohm or higher.

If d5/d1 or d6/d2 is greater than 2, because the surface area of the adhesive 83 decreases, the adhesive force between the reinforcing member 85 and the board 800 may decrease, and thus the reinforcing member 85 may easily escape the board 800.

Referring to FIG. 2D, the distance d7 between the first outer surface 5a (or the first outer surface 6b) of the second region 802 of the board 800 and the first side surface (or second side surface) of the reinforcing member 85 may be less than the distance d1 (d7<d1). The distance d8 between the third outer surface 5c of the second region 802 of the board 800 and the third side surface of the reinforcing member 85 may be less than the distance d2 (d8<d2).

For example, each of the distances d1 to d8 may be the shortest distance between two planes parallel to the two surfaces in question.

The thickness (for example, the thickness of the first portion 71a) T1 of the first noise-blocking portion 71 may be less than the depth H of the cavity 31 in the board 800 (T1<H). Here, the thickness of the first noise-blocking portion 71 may be the length of the first noise-blocking portion 71 in the optical-axis direction.

For example, the thickness (the thickness of the first portion 71a) T1 of the first noise-blocking portion 71 may range from 12 μm to 18 μm.

The side surfaces of the first portion 71a of the noise-blocking portion 71 may be positioned farther than the inner surfaces 31a to 31d of the cavity 31 from the outer surfaces 5a to 5c of the second region 802 of the board 800.

The side surfaces of the adhesive 83 may be positioned farther than the inner surfaces 31a to 31d of the cavity 31 from the outer surfaces 5a to 5c of the second region 802 of the board 800.

Furthermore, the outer surfaces of the reinforcing member 85 may be positioned closer than the side surfaces 31a to 31d of the cavity 31 in the board 300 to the outer surfaces 5a to 5c of the second region 802 of the board 800.

The surface area of the first portion 71a of the noise-blocking portion 71, which overlaps the second region 802 of the board 800 in the optical-axis direction of the lens moving unit 100 may be smaller than that of the bottom surface of the cavity 31.

Furthermore, the surface are of the adhesive 83 that overlaps the second region 802 of the board 800 in the optical-axis direction may be smaller than that of the bottom surface of the cavity 31 in the board 800.

The adhesive 83 may include adhesive resin and conductive particles.

Figure 6:
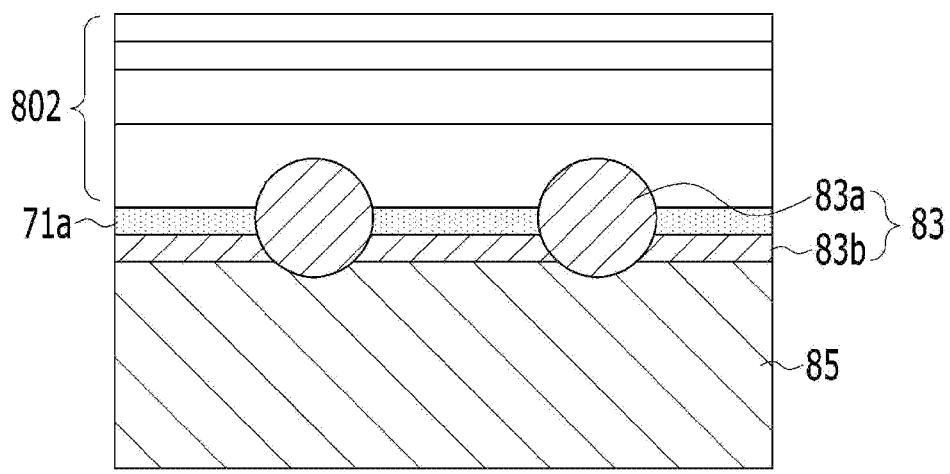
FIG. 6 is a view illustrating an embodiment of the adhesive.

FIG. 6 illustrates an embodiment of the adhesive 83.

Referring to FIG. 6, the adhesive 83 may include resin 83b and conductive particles 83a. The conductive particles 83a of the adhesive 83 are not depicted in FIG. 3.

Although the resin 83b may be a nonconductive resin layer, the disclosure is not limited thereto. In another embodiment, the resin 83b may be a conductive resin layer. For example, the resin 83b may be FGBF-700.

For example, the diameter of the conductive particle 83a may be greater than the thickness of the noise-blocking layer 71. Alternatively, the diameter of the conductive particle 83a may be greater than or equal to the depth H of the cavity 31.

For example, the thickness T2 of the adhesive 83 may be greater than the thickness T1 of the first noise-blocking portion 71 (T2>T1). For example, the thickness T2 of the adhesive 83 may range from 24 μm to 26 μm. For example, the thickness T2 of the adhesive 83 may be the maximum thickness of the adhesive, in consideration of the diameter of the conductive particles 83a.

The conductive particles 83a of the adhesive 83 may come into contact with the exposed pattern layer 82-6 of the second region 802 of the board 800 through the first noise-blocking portion 71 (for example, the first portion 71a).

The reinforcing member 850 may be conductively connected to the pattern layer 82-6 of the second region 802 of the board 800.

The thickness T3 of the reinforcing member 85 may be less than the overall thickness of the board 800 but greater than the thickness of the flexible substrate 800-1 and the thickness of the adhesive 83. For example, the thickness of the reinforcing member 85 may range from 90 μm to 120 μm.

The thickness T3 of the reinforcing member 85 may be greater than the thickness T1 of the first noise-blocking portion 71 and the thickness T2 of the adhesive 83 (T3>T1, T2).

Referring to FIGS. 3 and 4, the upper surface of the reinforcing member 85 may be in contact with the second surface (or the lower surface) 11b of the second region 802 of the board 800. For example, the upper surface of the periphery of the reinforcing member 85 may be in contact with the second surface (or the lower surface) 11b of the second region 802 of the board 800.

In another embodiment, the upper surface of the periphery of the reinforcing member 85 may be spaced apart from the second surface 11b of the second region 802 of the board 800.

Figure 7:
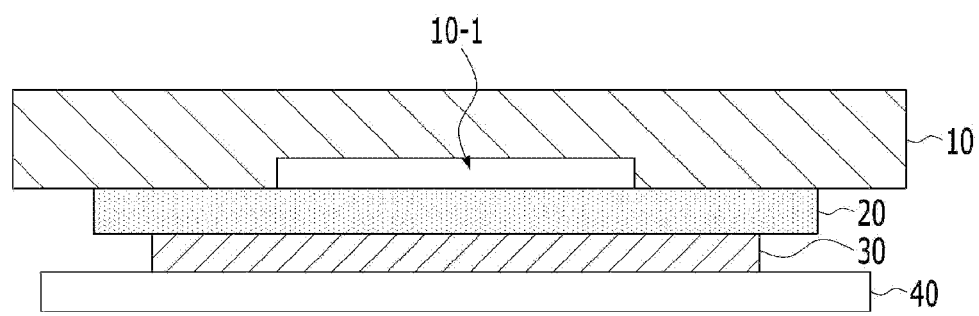
FIG. 7 is a view illustrating the case in which the size of an adhesive and the size of an EMI film are larger than the size of a groove in a board.

FIG. 7 illustrates the case in which the size of an adhesive 30 and the size of an EMI film 20 are larger than the size of a groove 10-1 in a board 10.

In this case, because the size of the EMI film 20 and the size of the adhesive 30 are larger than the size of the groove 10-1 in the board 10 through which a ground pattern layer 10a of the board 10 is exposed, when the EMI film 20 is attached to the lower surface of the board 10 and a reinforcing member 40 having the adhesive 30 applied thereto is attached to the EMI film 20, a void or a lifting phenomenon may occur between the ground pattern layer 10a of the board 10, which is exposed through the groove 10-1, and the reinforcing member 40, as illustrated in FIG. 7.

Furthermore, because the void is created between the adhesive 20 and the ground pattern layer 10a, the conductive particles of the adhesive 30 may have difficulty coming into contact with the ground pattern layer 10a through the EMI film 20 even when pressed using a hot press, whereby the resistance (for example, electrical resistance) between the ground of the board 10 and the reinforcing member 40 may increase. For example, in the case of FIG. 7, the resistance between the ground of the board 10 and the reinforcing member 40 may be 1 ohm or higher.

In contrast, the embodiment of the present invention is able to block or reduce EMI noise generated from the camera module 200 by positioning the first noise-blocking portion 71 between the pattern layer 82-6 that is exposed through the cavity 31 in the second region 802 of the board 800 and the reinforcing member 85. In addition, since the first noise-blocking portion 71 and the adhesive 83 are disposed in the cavity 31 such that the first noise-blocking portion 71 and the adhesive 83 are in close contact with the pattern layer 82-6, which is exposed through the cavity 31, it is possible to reduce the electrical resistance between the pattern layer 82-6 of the board 800, which is used as the ground, and the reinforcing member 85, and it is thus possible to use the reinforcing member 85 as the ground of the board 800. Specifically, according to the embodiment, the electrical resistance between the pattern layer 82-6 of the board 800 and the reinforcing member 85 may be lower than 1 ohm.

A camera module according to another embodiment may further include a noise-blocking portion, which is disposed at at least one of the first surface 11a and the second surface 11b of the first region 801 and the first surface 11a of the second region 802 of the board 800.

Figure 8:
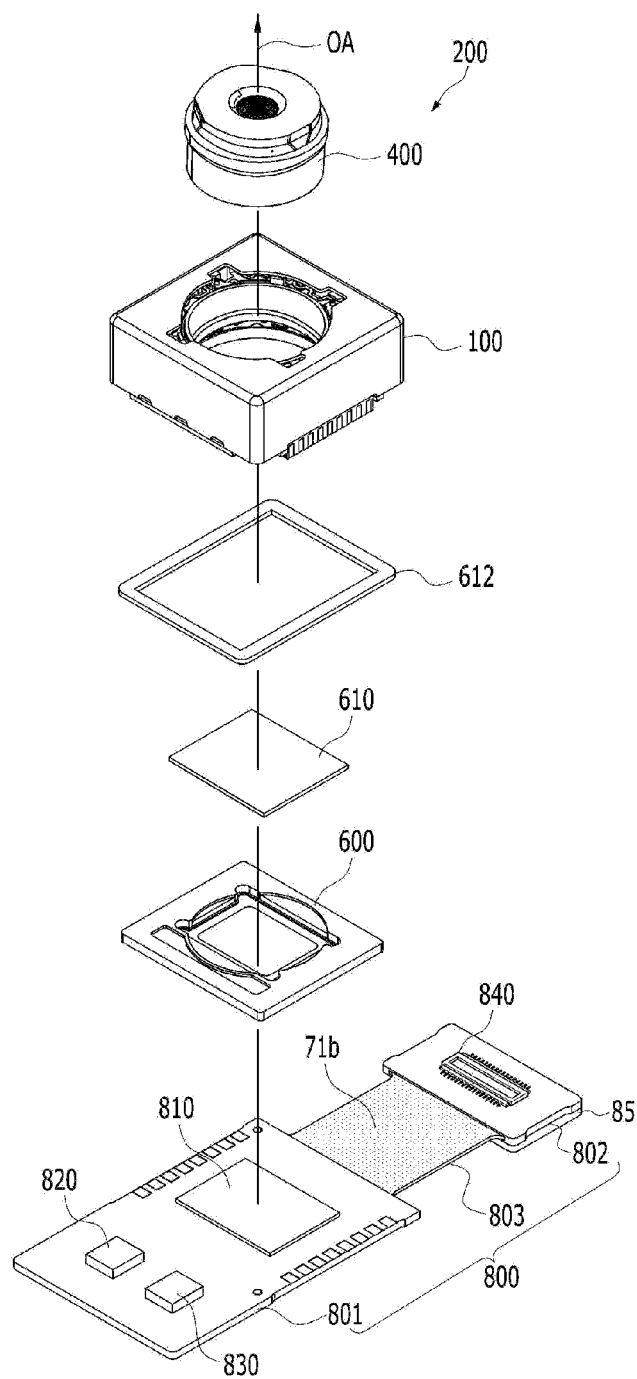
FIG. 8 is a perspective view of a camera module according to another embodiment.

FIG. 8 is a perspective view of a camera module according to another embodiment of the present invention.

Referring to FIG. 8, the camera module 200 may include a lens or a lens barrel 400, the lens moving unit 100, an adhesive member 612, a filter 610, a holder 600, a board 800, an image sensor 810, a motion sensor 820, a controller 830, a connector 840, a noise-blocking unit 70, an adhesive (not shown) and a reinforcing member 85. The same numerals as those in FIG. 1 indicate the same components, and descriptions of the same components will be made briefly or omitted.

The description regarding the noise-blocking unit 70, which has been made with reference to FIG. 1, may also be applied to the noise-blocking unit 70 shown in FIG. 8, the description regarding the adhesive 83, made with reference to FIG. 1, may also be applied to the noise-blocking unit (not shown) in FIG. 8, and the description regarding the reinforcing member, made with reference to FIG. 1, may also be applied to the reinforcing member 85 shown in FIG. 8.

The lens or lens barrel 400 may be mounted on the lens moving unit 100.

The lens moving unit 100 may be referred to as a "sensing unit", an "imaging unit", a "VCM (Voice Coil Motor)" or a "lens moving apparatus".

For example, the lens moving unit 100 may be an AF lens moving unit or an OIS lens moving unit. Here, the AF lens moving unit may be a unit capable of performing only an autofocus function, and the OIS lens moving unit may be a unit capable of performing both an autofocus function and an OIS (Optical Image Stabilizer) function.

For example, the lens moving unit 100 may be an AF lens moving device. The AF lens moving device may include a housing, a bobbin disposed in the housing, a coil disposed at the bobbin, a magnet disposed at the housing, at least one elastic member coupled both to the bobbin and to the housing, and a base disposed under the bobbin (and/or the housing). The elastic member may include, for example, the above-described upper and lower elastic members.

The coil may be provided with a drive signal (for example, driving current), and the bobbin may be moved in the optical-axis direction using the electromagnetic force resulting from the interaction between the coil and the magnet. In another embodiment, the coil may be disposed at the housing, and the magnet may be disposed at the bobbin.

For AF feedback operation, the AF lens moving device may further include a sensing magnet disposed at the bobbin, an AF position sensor (for example, a hall sensor) disposed at the housing, and a circuit board, at which the AF position sensor is disposed and which is disposed or mounted on the housing and/or the base. In another embodiment, the AF position sensor may be disposed at the bobbin, and the sensing magnet may be disposed at the housing.

The circuit board may be conductively connected to the coil and the AF position sensor. A drive signal may be provided to the coil and the AF position sensor via the circuit board, and the output of the AF position sensor may be transmitted to the circuit board.

The camera module according to another embodiment may include a housing, which is coupled to the lens or lens barrel 400 so as to hold the lens or lens barrel 400, in place of the lens moving unit 100, and the housing may be coupled or attached to the upper surface of the holder 600. The housing, which is attached or fixed to the holder 600, may be immovable, and may be maintained in the position in the state of being attached to the holder 600.

For example, the lens moving unit 100 may be an OIS lens moving unit.

The OIS lens moving unit may include a housing, a bobbin disposed in the housing so as to mount a lens or lens barrel 400 thereon, a first coil disposed at the bobbin, a magnet disposed at the housing so as to face the first coil, at least one upper elastic member coupled both to the upper portion of the bobbin and to the upper portion of the housing, at least one lower elastic member coupled both to the lower portion of the bobbin and to the lower portion of the housing, a second coil disposed under the bobbin (and/or the housing), a circuit board disposed under the second coil, and a base disposed under the circuit board.

The OIS lens moving unit may further include a cover member, which is coupled to the base so as to define a space for accommodating the components of the lens moving unit therein in conjunction with the base.

The OIS lens moving unit may further include a support member, which conductively connects the circuit board to the upper elastic member and supports the housing with respect to the base. Each of the first coil and the second coil may be conductively connected to the circuit board 250, and may receive a drive signal (drive current) from the circuit board.

For example, the upper elastic member may include a plurality of upper springs, and the support member may include support members connected to the upper springs. The first coil may be conductively connected to the circuit board via the upper springs and the support members. The circuit board may include a plurality of terminals, and some of the plurality of terminals may be conductively connected to the first coil and/or the second coil.

By virtue of the electromagnetic force resulting from the interaction between the first coil and the magnet, the bobbin and the lens or lens barrel 400 coupled to the bobbin is movable in the optical-axis direction such that the displacement of the bobbin in the optical-axis direction is controlled, thereby realizing an AF operation.

Furthermore, by virtue of the electromagnetic force resulting from the interaction between the second coil and the magnet, the housing is movable in a direction perpendicular to the optical-axis direction, thereby realizing handshake correction or OIS operation.

For AF feedback operation, the OIS lens moving unit may further include a sensing magnet disposed at the bobbin, and an AF position sensor (for example, a hall sensor) disposed at the housing. The OIS lens moving unit may further include a circuit board (not shown), which is disposed at the housing and/or the base and on which the AF position sensor is disposed or mounted. In another embodiment, the AF position sensor may be disposed at the bobbin, and the sensing magnet may be disposed at the housing. The OIS lens moving unit may further include a balancing magnet disposed at the bobbin so as to correspond to the sensing magnet.

The AF position sensor may output an output signal corresponding to the result of detection of variation in the intensity of the magnetic field of the sensing magnet due to movement of the bobbin. The AF position sensor may be conductively connected to the circuit board via the upper elastic member (or the lower elastic member) and/or the support member. The circuit board may provide a drive signal to the AF position sensor, and the output from the AF position sensor may be transmitted to the circuit board. The controller 830 may sense or detect the displacement of the bobbin using the output from the AF position sensor.

The holder 600 may be disposed under the lens moving unit 100 (for example, the base). The filter 610 may be mounted on the holder 600, and the holder 600 may include a projection 500 on which the filter 610 is to be seated.

The adhesive member 612 may couple or attach the lens moving unit 100 (for example, the base) to the holder 600. In addition to the attachment function described above, the adhesive member 6120 may serve to inhibit contaminants from entering the lens moving unit 100.

The adhesive member 612 may be thermohardening adhesive (for example, thermohardening epoxy) or ultraviolet-hardening adhesive (for example, ultraviolet-hardening epoxy).

The filter 610 may serve to inhibit light within a specific frequency band that passes through the lens barrel 400 from being introduced into the image sensor 810. The filter 610 may be, for example, an infrared-light-blocking filter, without being limited thereto. Here, the filter 610 may be oriented parallel to the X-Y plane.

The region of the holder 600 in which the filter 610 is mounted may be provided with a bore in order to allow the light that passes through the filter 610 to be introduced into the image sensor 810.

The board 800 may be disposed under the holder 600, and the image sensor 810 may be mounted on the board 600. The image sensor 810 may be the region on which an image included in the light that passes through the filter 610 and is introduced thereinto is formed.

The board 800 may include, for example, various circuits, devices, and a controller in order to convert the image formed on the image sensor 810 into electrical signals and to transmit the electrical signals to external components.

The board 800 may be embodied as a board on which the image sensor may be mounted, on which a circuit pattern may be formed, and to which various devices may be coupled. The holder 600 may alternatively be referred to as a "sensor base", and the board 800 may alternatively be referred to as a "circuit board".

In another embodiment, some region of the board 800 may be embodied as being included in the lens moving unit 100 or as not being included in the lens moving unit 100.

The image sensor 810 may receive an image included in the light introduced through the lens moving unit 100, and may convert the received image into an electrical signal.

The filter 610 and the image sensor 810 may be disposed so as to be spaced apart from each other in the state of facing each other in the optical-axis direction.

The motion sensor 820 may be mounted on the board 800, and may be conductively connected to the controller 830 through the circuit pattern formed on the board 800.

The motion sensor 820 may output rotational angular speed caused by motion of the camera module 200. The motion sensor 820 may be embodied as a dual-axis or triple-axis gyro sensor or an angular speed sensor.

The controller 830 may be mounted on the board 800, and may be conductively connected to the lens moving unit 100. The controller 830 may provide the lens moving unit 100 with a signal for driving the AF coil, a signal for driving the OIS coil, a signal for driving the AF position sensor and/or a signal for driving the OIS (Optical Image Stabilization) position sensor.

Furthermore, the controller 830 may receive the output from the AF position sensor and/or the output from the OIS position sensor. Furthermore, the controller 830 may provide the AF coil with a signal for AF feedback operation using the output from the AF position sensor, and may provide the OIS coil with a signal for OIS feedback operation using the output from the OIS position sensor of the lens moving unit 100.

The connector 840 may be conductively connected to the board 800, and may have a port that is intended to be conductively connected to an external device.

The lens moving unit 100 according to the embodiment may be included in an optical instrument, which is designed to form the image of an object in a space using reflection, refraction, absorption, interference, diffraction or the like, which are characteristics of light, to extend eyesight, to record an image obtained through a lens or to reproduce the image, to perform optical measurement, or to propagate or transmit an image. For example, although the optical instrument according to the embodiment may be a mobile phone, cellular phone, smart phone, portable smart instrument, digital camera, laptop computer, digital broadcasting terminal, PDA (Personal Digital Assistant), PMP (Portable Multimedia Player), navigation device, or the like, the disclosure is not limited thereto. Furthermore, any device capable of taking images or photographs is possible.

Figure 9:
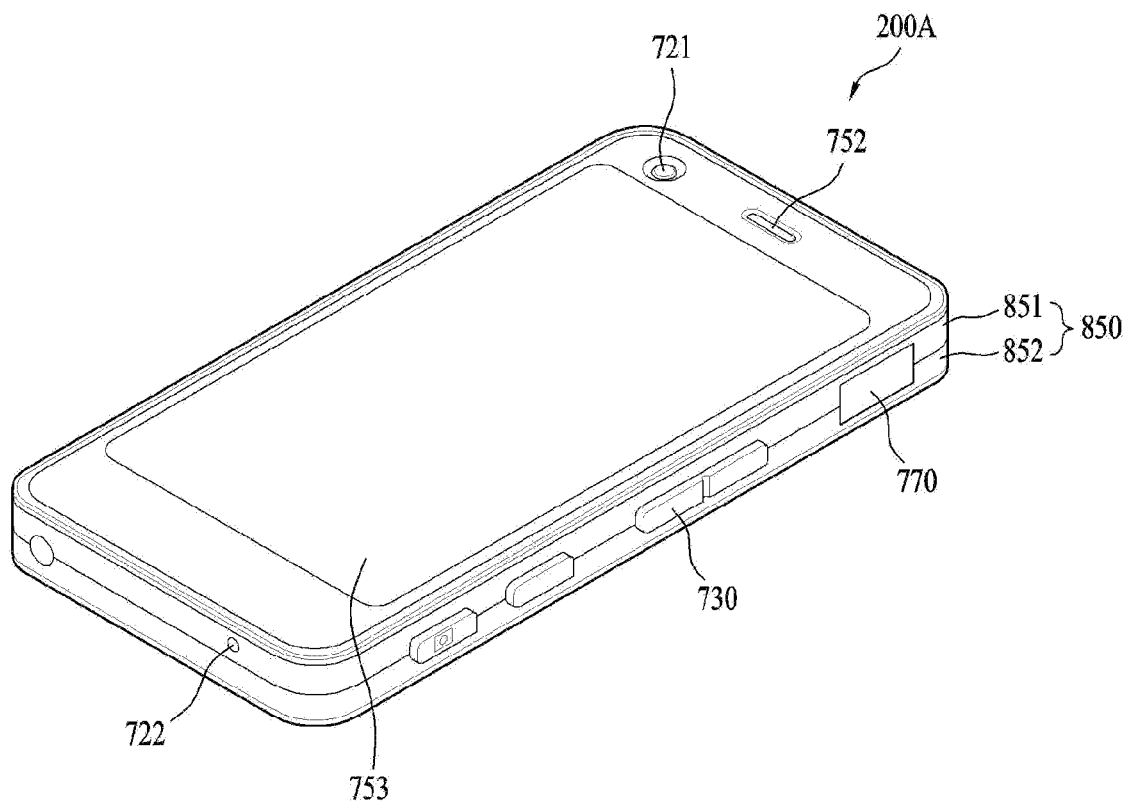
FIG. 9 is a perspective view of a portable terminal according to an embodiment.
Figure 10:
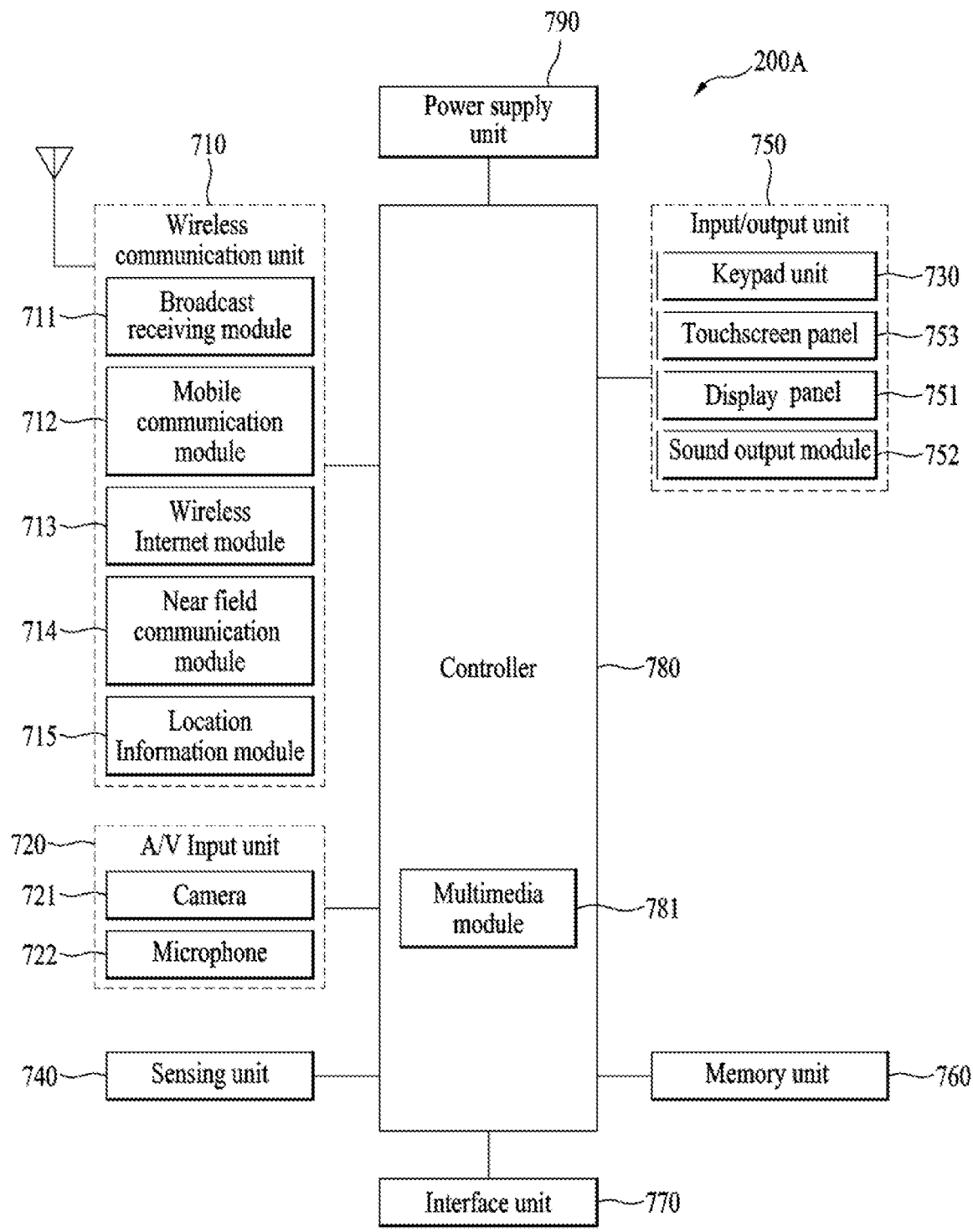
FIG. 10 is a view illustrating the configuration of the portable terminal illustrated in FIG. 9.

FIG. 9 is a perspective view illustrating a portable terminal 200A according to an embodiment. FIG. 10 is a view illustrating the configuration of the portable terminal illustrated in FIG. 9.

Referring to FIGS. 9 and 10, the portable terminal 200A (hereinafter referred to as a "terminal") may include a body 850, a wireless communication unit 710, an audio/video (A/V) input unit 720, a sensing unit 740, an input/output unit 750, a memory unit 760, an interface unit 770, a controller 780, and a power supply unit 790.

The body 850 illustrated in FIG. 9 has a bar shape, without being limited thereto, and may be any of various types, such as, for example, a slide type, a folder type, a swing type, or a swivel type, in which two or more sub-bodies are coupled so as to be movable relative to each other.

The body 850 may include a case (e.g. a casing, housing, or cover) defining the external appearance of the terminal. For example, the body 850 may be divided into a front case 851 and a rear case 852. Various electronic components of the terminal may be accommodated in the space defined between the front case 851 and the rear case 852.

The wireless communication unit 710 may include one or more modules, which enable wireless communication between the terminal 200A and a wireless communication system or between the terminal 200A and a network in which the terminal 200A is located. For example, the wireless communication unit 710 may include a broadcast-receiving module 711, a mobile communication module 712, a wireless Internet module 713, a nearfield communication module 714, and a location information module 715.

The A/V input unit 720 serves to input audio signals or video signals, and may include, for example, a camera 721 and a microphone 722.

The camera 721 may include the camera module 200 according to the embodiment illustrated in FIG. 1 or 8. As described above, since the camera module 200 is capable of improving EMI-noise-blocking performance, it is possible to improve the RF (Radio Frequency) sensitivity of the portable terminal 200A.

The sensing unit 740 may sense the current state of the terminal 200A, such as, for example, the opening or closing of the terminal 200A, the location of the terminal 200A, the presence of a user's touch, the orientation of the terminal 200A, or the acceleration/deceleration of the terminal 200A, and may generate a sensing signal to control the operation of the terminal 200A. When the terminal 200A is, for example, a slide-type cellular phone, the sensing unit 740 may sense whether the slide-type cellular phone is opened or closed. Furthermore, the sensing unit 740 may sense the supply of power from the power supply unit 790, coupling of the interface unit 770 to an external device, and the like.

The input/output unit 750 serves to generate, for example, visual, audible, or tactile input or output. The input/output unit 750 may generate input data to control the operation of the terminal 200A, and may display information processed in the terminal 200A.

The input/output unit 750 may include a keypad unit 730, a display module 751, a sound output module 752, and a touchscreen panel 753. The keypad unit 730 may generate input data in response to input on a keypad.

The display module 751 may include a plurality of pixels, the color of which varies depending on the electrical signals applied thereto. For example, the display module 751 may include at least one among a liquid crystal display, a thin-film transistor liquid crystal display, an organic light-emitting diode, a flexible display and a 3D display.

The sound output module 752 may output audio data received from the wireless communication unit 710 in, for example, a call-signal reception mode, a call mode, a recording mode, a voice recognition mode, or a broadcast reception mode, or may output audio data stored in the memory unit 760.

The touchscreen panel 753 may convert variation in capacitance, caused by a user's touch on a specific region of a touchscreen, into electrical input signals.

The memory unit 760 may temporarily store programs for the processing and control of the controller 780, and input/output data (for example, telephone numbers, messages, audio data, stationary images, moving images and the like). For example, the memory unit 760 may store images captured by the camera 721, for example, pictures or moving images.

The interface unit 770 serves as a path through which the lens moving unit is connected to an external device connected to the terminal 200A. The interface unit 770 may receive power or data from the external component, and may transmit the same to respective constituent elements inside the terminal 200A, or may transmit data inside the terminal 200A to the external component. For example, the interface unit 770 may include a wired/wireless headset port, an external charger port, a wired/wireless data port, a memory card port, a port for connection to a device equipped with an identification module, an audio input/output (I/O) port, a video input/output (I/O) port, an earphone port and the like.

The controller 780 may control the general operation of the terminal 200A. For example, the controller 780 may perform control and processing related to, for example, voice calls, data communication, and video calls.

The controller 780 may include a multimedia module 781 for multimedia playback. The multimedia module 781 may be embodied in the controller 780, or may be embodied separately from the controller 780.

The controller 780 may perform a pattern recognition process capable of recognizing writing input or drawing input carried out on a touch screen as a character and an image, respectively.

The power supply unit 790 may supply power required to operate the respective constituent elements upon receiving external power or internal power under the control of the controller 780.

The features, configurations, effects and the like described above in the embodiments are included in at least one embodiment, but the invention is not limited only to the embodiments. In addition, the features, configurations, effects and the like exemplified in the respective embodiments may be combined with other embodiments or modified by those skilled in the art. Accordingly, content related to these combinations and modifications should be construed as falling within the scope of the disclosure.

INDUSTRIAL APPLICABILITY

The embodiments are applicable to a camera module and an optical device including the same, which are capable of improving performance of blocking EMI noise and of reducing the electrical resistance between the reinforcing member and a ground of a board.

The invention claimed is:

1. A camera module comprising:
   a circuit board comprising a first region, a second region comprising a cavity and a ground layer exposed by the cavity, and a third region connecting the first region and the second region;
   a lens moving unit disposed on the first region of the circuit board;
   a connector disposed on the second region of the circuit board; and
   a noise blocking unit comprising a first portion contacting the ground layer of the second region and a second portion disposed on the third region,
   wherein the cavity comprises a first inner surface, a second inner surface opposite to the first inner surface, and a third inner surface opposite to the second portion of the noise blocking unit and connecting the first inner surface and the second inner surface,
   wherein the first portion of the noise-blocking unit is spaced apart from the first to third inner surfaces of the cavity.

2. The camera module according to claim 1, wherein the first portion of the noise-blocking unit comprises a first surface facing the first inner surface of the cavity, a second surface facing the second inner surface of the cavity, and a third surface facing the third inner surface of the cavity.

3. The camera module according to claim 2, wherein a length of the first surface of the first portion in a first direction is less than a length of the first inner surface of the cavity of the circuit board in the first direction when viewed in a plan view, and the first direction is a direction from the first inner surface of the cavity to the second inner surface of the cavity.

4. The camera module according to claim 1, wherein the ground layer defines a bottom surface of the cavity.

5. The camera module according to claim 1, comprising a reinforcing member disposed on the noise-blocking unit and disposed over the cavity.

6. The camera module according to claim 5, comprising an adhesive disposed between the reinforcing member and the noise-blocking unit.

7. The camera module according to claim 6, wherein a portion of the adhesive is disposed in the cavity.

8. The camera module according to claim 6, wherein the adhesive comprises a conductive particle contacting the ground layer through the noise-blocking unit.

9. The camera module according to claim 5, wherein a resistance value between the reinforcing member and the ground layer is lower than 1 ohm.

10. The camera module according to claim 5, wherein the reinforcing member is made of conductive metal.

11. The camera module according to claim 1, wherein the noise-blocking unit comprises a third portion connecting the first portion and the second portion.

12. The camera module according to claim 1, wherein the first region and the second region are a rigid substrate, and the third region is a flexible substrate.

13. The camera module according to claim 1, wherein the connector is disposed opposite to the first portion of the noise-blocking unit.

14. A camera module comprising:
   a circuit board comprising a first region, a second region comprising a ground layer, and a third region connecting the first region and the second region;
   a lens moving unit disposed on the first region of the circuit board;

a connector disposed on the second region of the circuit board;

a noise-blocking unit comprising a first portion contacting the ground layer of the second region and a second portion disposed on the third region; and a reinforcing member disposed on the first portion of the noise-blocking unit, wherein the second region comprises a cavity exposing the ground layer, wherein the second region comprises a first outer surface, a second outer surface opposite to the first outer surface, and a third outer surface opposite to the second portion of the noise-blocking unit, and wherein the third outer surface of the second region is positioned closer to an inner surface of the cavity than to the first portion of the noise blocking unit.

15. The camera module according to claim 14, wherein a length of the second region in a first direction is greater than a length of the second region in a second direction perpendicular to the first direction, and the first direction is a direction from the first outer surface of the second region toward the second outer surface of the second region.

16. The camera module according to claim 15, wherein a distance between the first outer surface of the second region and the first portion of the noise blocking unit is smaller than a distance between the third outer surface of the second region and the first portion of the noise-blocking unit.

17. The camera module according to claim 14, comprising an adhesive disposed between the reinforcing member and the first portion of the noise-blocking unit.

18. The camera module according to claim 15, wherein the second region comprises a cavity exposing the ground layer and a length of the first portion in the first direction is less than a length of the cavity in the first direction.

19. The camera module according to claim 14, comprising a connector disposed on the second region of the circuit board, wherein the connector is opposite to the reinforcing member.

20. An optical instrument comprising the camera module according to claim 1.

* * * * *